United States Patent
Sasaki et al.

(10) Patent No.: US 8,148,816 B2
(45) Date of Patent: Apr. 3, 2012

(54) SEMICONDUCTOR DEVICE

(75) Inventors: Hideki Sasaki, Tokyo (JP); Yuuki Fujimura, Tokyo (JP); Katsumi Kikuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 240 days.

(21) Appl. No.: 12/522,816

(22) PCT Filed: Jan. 11, 2008

(86) PCT No.: PCT/JP2008/050241
§ 371 (c)(1),
(2), (4) Date: Jul. 10, 2009

(87) PCT Pub. No.: WO2008/084841
PCT Pub. Date: Jul. 17, 2008

(65) Prior Publication Data
US 2009/0315167 A1    Dec. 24, 2009

(30) Foreign Application Priority Data

Jan. 11, 2007    (JP) .................................. 2007-003452

(51) Int. Cl.
*H01L 23/34*    (2006.01)
*H01L 23/52*    (2006.01)
(52) U.S. Cl. ........ 257/724; 257/686; 257/730; 257/738; 257/777; 257/E23.141

(58) Field of Classification Search .................. 257/686, 257/730, E23.141
See application file for complete search history.

(56) References Cited

U.S. PATENT DOCUMENTS

| | | | |
|---|---|---|---|
| 6,472,747 B2 * | 10/2002 | Bazarjani et al. | 257/724 |
| 2007/0045828 A1 * | 3/2007 | Kwon et al. | 257/723 |

FOREIGN PATENT DOCUMENTS

| | | |
|---|---|---|
| JP | 2004031649 A | 1/2004 |
| JP | 2004111656 A | 4/2004 |
| JP | 2004165269 A | 6/2004 |
| JP | 2004523912 A | 8/2004 |
| JP | 2005150613 A | 6/2005 |
| JP | 2006073625 A | 3/2006 |
| JP | 2006216770 A | 8/2006 |

OTHER PUBLICATIONS

International Search Report for PCT/JP2008/050241 mailed Apr. 15, 2008.

\* cited by examiner

*Primary Examiner* — N Drew Richards
*Assistant Examiner* — Mamadou Diallo

(57) ABSTRACT

A semiconductor device in which a plurality of semiconductor chips is stacked. A first semiconductor chip is stacked in a region, on a second semiconductor chip, in which a circuit that generates noise is not disposed within said second semiconductor chip, and a wire of a circuit that easily receives noise within said first semiconductor chip is disposed so as not to extend over said circuit that generates noise.

15 Claims, 18 Drawing Sheets

FIG. 14A (RELATED ART 1)
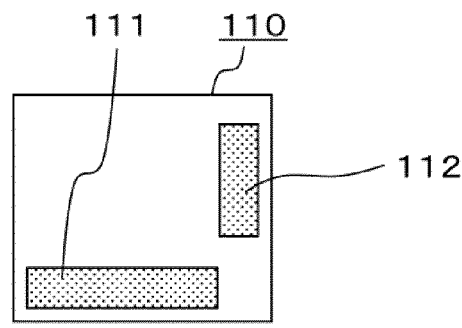
FIG. 14B (RELATED ART 1)
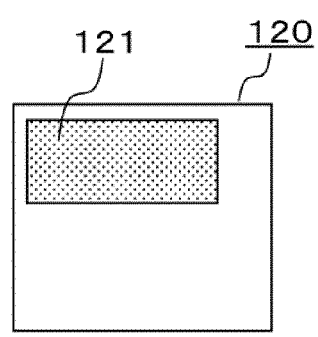
FIG. 14C (RELATED ART 1)
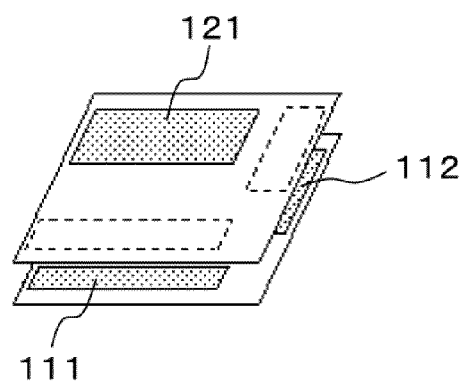

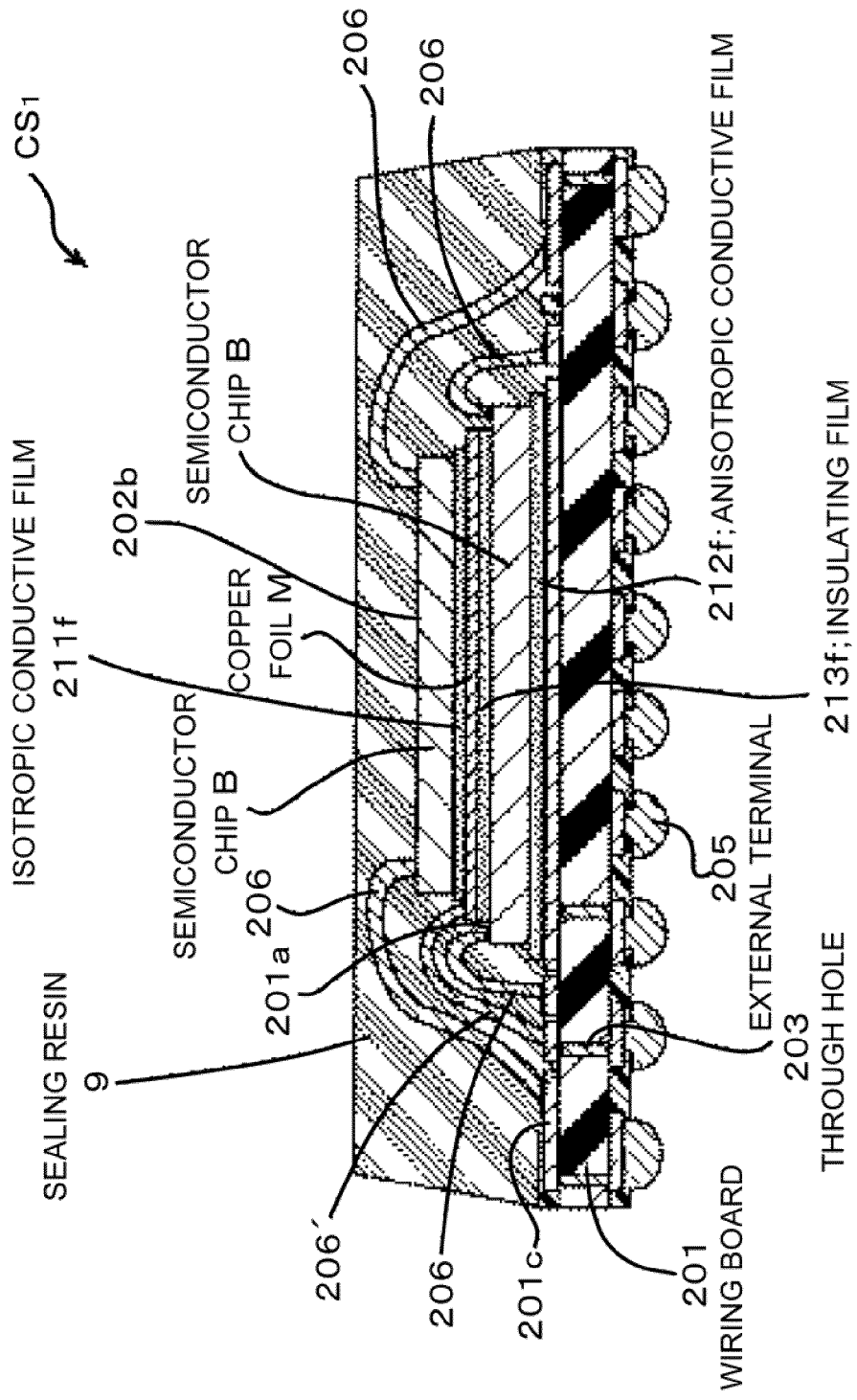
FIG. 15 (RELATED ART 2)

SEMICONDUCTOR DEVICE

This application is the National Phase of PCT/JP2008/050241, filed Jan. 11, 2008, which is based upon and claims the benefit of the priority of Japanese Patent Application No. 2007-003452 (filed on Jan. 11, 2007), the disclosure of which is incorporated herein in its entirety by reference thereto.

TECHNICAL FIELD

The present invention relates to a semiconductor device in which are stacked a plurality of semiconductor chips, and in particular, to a semiconductor device in which are stacked semiconductor chips mounting therein a circuit apt to generate noise and a semiconductor chip in which a circuit susceptible to noise is mounted.

BACKGROUND ART

Accompanying technological developments in recent years, semiconductor devices in which a plurality of semiconductor chips are stacked in one package are being put to practical use, and are beginning to be installed in mobile telephones, digital cameras, and the like. In many of these, an information processing LSI such as a microcontroller or the like, and a memory LSI for storing information processing data are stacked. A semiconductor device in which a plurality of semiconductor chips are stacked in one package in this way is referred to as a Multi-Chip Package (MCP) or a System-in-Package (SiP), and henceforth it is expected that this package structure applied in small/thin forms will be used also in combinations of semiconductor chips outside of the information processing LSI and the memory LSI.

Besides of the abovementioned semiconductor chip combination, combinations are henceforth expected of different types of chip, such as analog chips, digital chips, RF (Radio Frequency) chips, power supply chips, and the like. The background to this is that, rather than build circuits, which have different manufacturing processes, into one semiconductor chip, it is expected that by manufacturing various semiconductor chips by separate processes and putting them into one package, product cost will be made cheaper.

However, in this type of semiconductor chip combination, different to conventional combinations, there will be cases where it is necessary to avoid noise interference from a circuit apt to generate noise inside a semiconductor chip to a circuit susceptible to noise inside another semiconductor chip. From this type of background, there are disclosures of several semiconductor devices that have as an object the solution of this problem.

For example, Patent Document 1 discloses a stacked form of semiconductor device in which, in a state in which a plurality of semiconductor chips 110 and 120 are stacked so as to overlap, a circuit (power supply part 111, output amplifier part, 112) that generates noise in one semiconductor chip 110, and a circuit (analog circuit part 121) that easily receives noise in the other semiconductor chip 120 are disposed so as not to mutually overlap (refer to related art 1, FIGS. 14A to 14C).

Furthermore, Patent Document 2 discloses a semiconductor device in which a semiconductor chip that generates noise and a semiconductor chip that easily receives this noise are stacked, and in order to avoid noise being propagated between the two overlapping semiconductor chips, an isotropic conductive film 211f, a copper foil M, and an insulating film 213f are sandwiched between semiconductor chips A and B, in sequence from the semiconductor chip B side, and the copper foil M is connected to a power supply potential or a ground potential (refer to related art 2, FIG. 15).

Furthermore, Patent Document 3 discloses a semiconductor device in which a heat transfer conductive plate 305 is inserted between semiconductor chips 303 and 304, and this heat transfer conductive plate 305 is connected to ground wiring of a substrate 302 through bonding wire 309 (refer to related art 3, FIG. 16).

[Patent Document 1]
  JP Patent Kokai Publication No. JP-P2004-165269A
[Patent Document 2]
  JP Patent Kokai Publication No. JP-P2004-31649A
[Patent Document 3]
  JP Patent Kokai Publication No. JP-P2004-111656A

SUMMARY

The disclosures of the abovementioned Patent Documents 1 to 3 are incorporated herein by reference thereto. The following analysis on the related technology is given according to the present invention.

At the same time, there is an important problem in the semiconductor device (refer to FIGS. 14A to 14C) disclosed in this Patent Document 1. This problem is that, with regard to a region in which semiconductor chips overlap, only noise interference between places at which noise is generated and places at which noise is received are envisaged, and wiring is not considered. That is, wiring is not considered at important places at which noise may be generated, and conversely at important places at which noise may be received, occupying a large area in the semiconductor device.

For example, FIG. 17 and FIG. 18 relate to one example of the semiconductor device in which a semiconductor chip 404 that easily receives noise is stacked upon a semiconductor chip 403 that generates noise. As in Patent Document 1, a DC/DC converter circuit 403a that generates noise and a PLL (Phase Locked Loop) circuit 404a that easily receives noise are not overlapping, but since wires 408b of the PLL circuit 404a overlap above the DC/DC converter circuit 403a, a problem arises in that noise generated by the DC/DC converter circuit 403a is mixed into the PLL circuit 404a through the wires 408b. Furthermore, since the wires 408b of the PLL circuit 404a and wires 407 of the DC/DC converter circuit 403a run in parallel, a problem arises in that noise gets mixed in through the wires. In addition, with the configuration of FIG. 17 and FIG. 18, cases where the PLL circuit 404a and the DC/DC converter circuit 403a are reversed, are also envisaged. In such cases, noise of the DC/DC converter circuit is generated from the wires, and is mixed into the PLL circuit immediately below these wires and the wires of the PLL circuit.

In a conventional type of memory and logic combination, noise interference between circuit block and wires, and among the wires, as in the reference case of FIG. 17 and FIG. 18, has not been a problem, but if different types of chips, such as an analog chip, a digital chip, an RF chip, a power supply chip, and the like, are combined, in all combinations of these semiconductor chips, if this matter is not considered, it tends to be impossible to realize a semiconductor device in which characteristic deterioration due to noise interference is suppressed.

Furthermore, with trends in semiconductor devices in which a plurality of semiconductor chips are stacked, since there is a strong demand for making these thinner, there is gradual tendency to make thickness of each semiconductor chip that is stacked therein thinner little by little, as in 200 μm, 150 μm, 100 μm, 50 μm, and 25 μm. If the semiconductor chips are made thinner in this way, in the semiconductor device as shown in FIG. 17 and FIG. 18, wires and circuit face become increasingly close, the noise interference between the wires and the circuit face becomes more significant, and the semiconductor device characteristic deteriorates more easily due to noise interference.

Furthermore, the semiconductor devices disclosed in Patent Documents 2 and 3 have had the same problematic point. This problematic point is that places at which noise is generated and places that easily receive the noise are semiconductor chips themselves or circuits inside the semiconductor chips, similar to Patent Document 1, and the fact that the wires generate noise or receive noise is not envisaged.

In Patent Document 2 (refer to FIG. 15), since there is a configuration in which an isotropic conductive film 211f is affixed to a back side of a semiconductor chip A, in cases, with regard to a semiconductor chip B, where there is a circuit that generates noise or a circuit that receives noise in a portion in which the semiconductor chips A and B are not overlapping, it has not been possible to suppress noise generated through wires 206 or noise that is mixed-in.

In Patent Document 3 (refer to FIG. 16), there is a description that it is possible to cut off propagation of noise between a lower layer semiconductor chip 303 and an upper layer semiconductor chip 304 by inserting a heat transfer conductive plate 305 between stacked semiconductor chips 303 and 304, but there is no reference at all to generating noise and receiving noise by a wire.

Furthermore, the semiconductor devices disclosed in Patent Documents 2 and 3 have had another problematic point. This problematic point is that an anisotropic conductive film and heat transfer conductive plate are disposed to be in proximity of the entire circuit face of the semiconductor chips.

In many recent semiconductor chips, a circuit that easily generates noise and a circuit that easily receives noise are disposed inside these chips, and design is carried out to isolate this by making a high impedance wall inside the chips. However, if the heat transfer conductive plate of low impedance or the anisotropic conductive film extends over the entire circuit face or is disposed to be in proximity of the circuit face, there is a risk of propagating from a circuit where there is noise to other circuits, through this heat transfer conductive plate or the anisotropic conductive film. As a result, with regard to disposing the heat transfer conductive plate of low impedance or the anisotropic conductive film, being extended over the entire circuit face, even if there is an effect of suppression of noise interference between the semiconductor chips, there has been a possibility of an adverse effect in suppression of noise interference inside the semiconductor chips.

It is a principal object of the present invention to provide a semiconductor device in which a plurality of semiconductor chips are stacked, wherein, in addition to avoiding noise interference between circuits of the semiconductor chips, it is possible to avoid noise interference from a circuit that generates noise to a circuit that easily receives noise, through a wire.

According to a first aspect of the present invention, in a semiconductor device in which a plurality of semiconductor chips is stacked, a first semiconductor chip is stacked in a region, on a second semiconductor chip, in which a circuit that generates noise is not disposed within the second semiconductor chip, and a wire of a circuit that easily receives noise within the first semiconductor chip is disposed so as not to extend over (cross-over) the circuit that generates noise.

According to a second aspect of the present invention, in a semiconductor device in which a plurality of semiconductor chips is stacked, a first semiconductor chip is stacked in a region, on a second semiconductor chip, in which a circuit that generates noise is not disposed within the second semiconductor chip, and a wire of a circuit that easily receives noise within the first semiconductor chip is disposed in a diagonally opposing direction with respect to a wire of the circuit that generates noise.

According to a third aspect of the present invention, in a semiconductor device in which a plurality of semiconductor chips is stacked, a first semiconductor chip is stacked in a region, on a second semiconductor chip, in which a circuit that generates noise is not disposed within the second semiconductor chip, a circuit that easily receives noise within the first semiconductor chip is disposed in a position diagonally opposing the circuit that generates noise, and a wire of the circuit that easily receives noise is disposed in a diagonally opposing direction with respect to a wire of the circuit that generates noise.

According to a fourth aspect of the present invention, in a semiconductor device in which a plurality of semiconductor chips is stacked, a first semiconductor chip is stacked in a region, on a second semiconductor chip, in which a circuit that generates noise is not disposed within the second semiconductor chip, a circuit that easily receives noise within the first semiconductor chip is disposed so as to be separated from the circuit that generates noise, and a wire of the circuit that easily receives noise is disposed so as not to run in parallel to a wire of the circuit that generates noise.

According to a fifth aspect of the present invention, in a semiconductor device in which a plurality of semiconductor chips is stacked, a first semiconductor chip is stacked in a region on a second semiconductor chip, in which a circuit that easily receives noise is not disposed within the second semiconductor chip, and a wire of a circuit that generates noise within the first semiconductor chip is disposed so as not to extend over (cross-over) the circuit that easily receives noise.

According to a sixth aspect of the present invention, in a semiconductor device in which a plurality of semiconductor chips is stacked, a first semiconductor chip is stacked in a region, on a second semiconductor chip, in which a circuit that easily receives noise is not disposed within the second semiconductor chip, and a wire of a circuit that generates noise within the first semiconductor chip is disposed in a diagonally opposing direction with respect to a wire of the circuit that easily receives noise.

According to a seventh aspect of the present invention, in a semiconductor device in which a plurality of semiconductor chips is stacked, a first semiconductor chip is stacked in a region, on a second semiconductor chip, in which a circuit that easily receives noise is not disposed within the second semiconductor chip, a circuit that generates noise within the first semiconductor chip is disposed in a position diagonally opposing the circuit that easily receives noise, and a wire of the circuit that generates noise is disposed in a diagonally opposing direction with respect to a wire of the circuit that easily receives noise.

According to an eighth aspect of the present invention, in a semiconductor device in which a plurality of semiconductor chips is stacked, a first semiconductor chip is stacked in a region, on a second semiconductor chip, in which a circuit that easily receives noise is not disposed within the second semiconductor chip, a circuit that generates noise within the semiconductor chip is disposed so as to be separated from the circuit that easily receives noise, and a wire of the circuit that generates noise is disposed so as not to run parallel to a wire of the circuit that easily receives noise.

According to a ninth aspect of the present invention, in a semiconductor device in which a plurality of semiconductor chips is stacked, a first semiconductor chip is stacked in a region, on a second semiconductor chip, in which a circuit that generates noise is not disposed within the second semiconductor chip, and a wire of a circuit that easily receives noise within the first semiconductor chip is disposed so as to extend over (cross-over) a conductor layer disposed on the circuit that generates noise.

According to a tenth aspect of the present invention, in a semiconductor device in which a plurality of semiconductor chips is stacked, a first semiconductor chip is stacked in a region, on a second semiconductor chip, in which a circuit that easily receives noise is not disposed within the second semiconductor chip, and a wire of a circuit that generates noise within the first semiconductor chip is disposed so as to extend over (cross-over) a conductor layer disposed on the circuit that easily receives noise.

In the semiconductor device of the present invention, the circuit that generates noise is preferably a switching circuit such as a DC/DC converter circuit or the like.

In the semiconductor device of the present invention, a wire of the circuit that generates noise is preferably a wire that is connected to any of an output terminal, a power supply terminal, and a ground terminal of the switching circuit.

In the semiconductor device of the present invention, the circuit that easily receives noise is preferably an analog circuit such as a PLL circuit, an ADC (Analog Digital Converter), a DAC (Digital Analog Converter), or the like.

In the semiconductor device of the present invention, a wire of the circuit that easily receives noise is preferably a wire that is connected to any of an input terminal, a power supply terminal, and a ground terminal of the analog circuit.

In the semiconductor device of the present invention, the conductor layer is preferably connected to a guard ring formed in a periphery of a circuit disposed under the conductor layer.

According to the present invention (claims 1 to 8), a circuit that generates noise and a circuit that easily receives noise do not overlap at places at which stacked semiconductor chips overlap, and furthermore, since also a wire connected to each circuit is not adjacent to (or in a proximity of) a circuit that generates noise and a circuit that easily receives noise, there is little characteristic deterioration of the semiconductor device due to mixing in of noise.

According to the present invention (claims 9 and 10), even if a wire connected to each circuit is disposed above a circuit that generates noise and a circuit that easily receives noise, since a conductor layer is formed on these circuits, there is little characteristic deterioration due to mixing in of noise. At the same time, since the conductor layer only covers a specific circuit(s), due to this conductor layer there is no noise interference from the specific circuit(s) to other circuits inside the same semiconductor chip, and there is no noise interference from the other circuit(s) to the specific circuit(s) inside the same semiconductor chip.

BRIEF DESCRIPTION OF THE DRAWINGS

FIGS. 14A to 14C schematically show configurations of the semiconductor device according to a related art 1; FIG. 14A is a plan view of a semiconductor chip of a first layer, FIG. 14B is a plan view of a semiconductor chip of a second layer, and FIG. 14C is a perspective view of a chip-stack type semiconductor device.

FIG. 15 is a cross-sectional view schematically showing a configuration of the semiconductor device according to related art 2.

Figure 1:
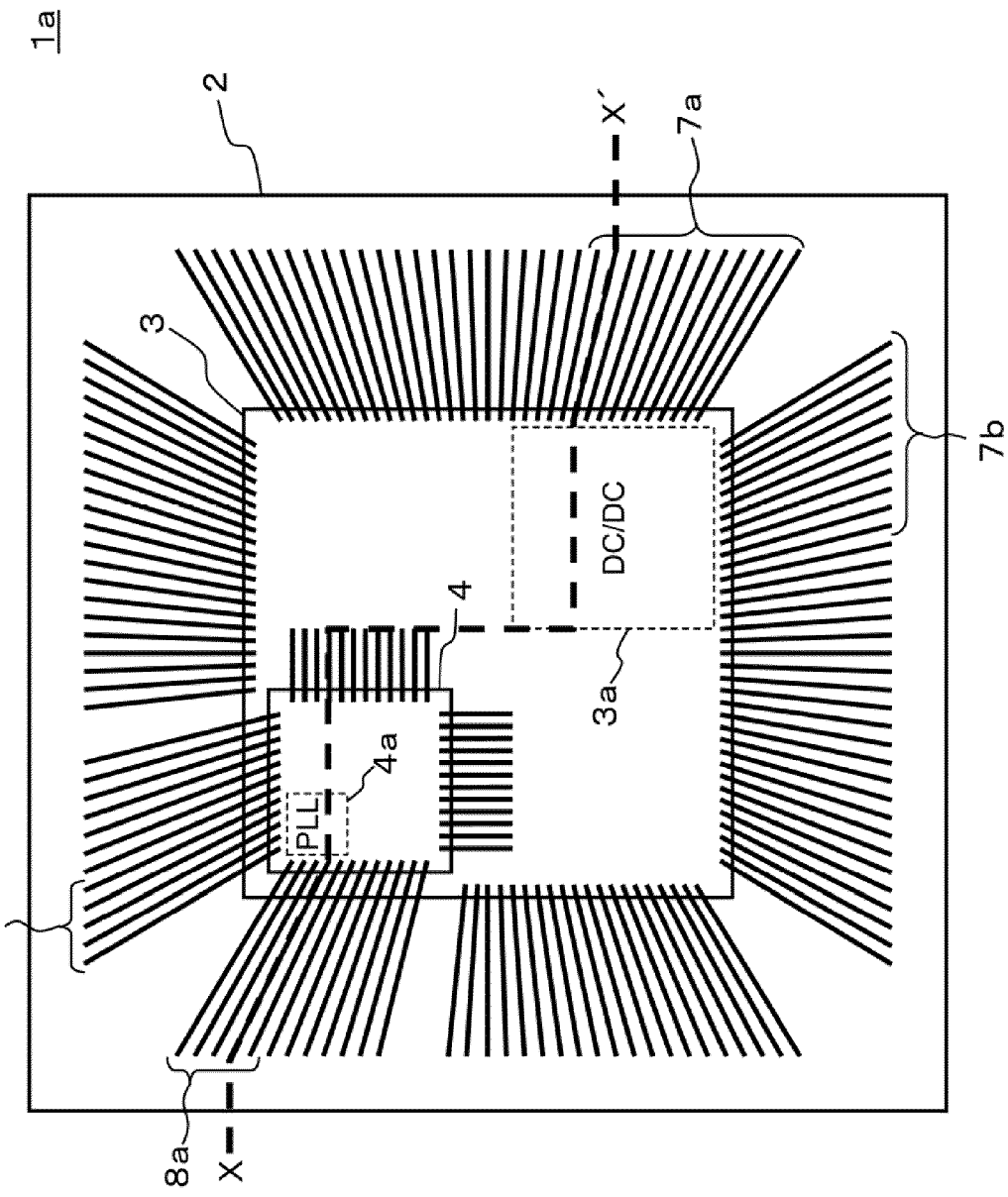
FIG. 1 is a plan view schematically showing a configuration of a semiconductor device according to exemplary embodiment 1 of the present invention.

EXPLANATIONS OF REFERENCE SYMBOLS 1a, 1b, 1c, 1d, 1e semiconductor device
2 substrate
3 semiconductor chip
3a, 3b, 3c DC/DC converter circuit (circuit that generates noise)
4 semiconductor chip
4a PLL circuit (circuit that easily receives noise)
7 wire 7a, 7b, 7c, 7d, 7e, 7f wire (for circuit that generates noise)
8 wire
8a, 8b wire (for circuit that easily receives noise)
9 mold resin
10 BGA pad
20 conductor layer
21 connection via
22 insulating layer
110 semiconductor chip
111 power supply part
112 output amplifier part
120 semiconductor chip
121 analog circuit part
201 wiring board
201c wiring layer
202a, 202b circuit face
203 through hole
205 external terminal
206, 206' bonding wire
209 sealing resin
211f isotropic conductive film
212f anisotropic conductive film
213f insulating film
CS1 semiconductor device
301 semiconductor device
302 substrate
302a bump
303 lower layer semiconductor chip
304 upper layer semiconductor chip
305 heat transfer electro-conductive plate
306 mold resin
307, 308, 309 bonding wire
401 semiconductor device
402 substrate
403 semiconductor chip
403a DC/DC converter circuit
404 semiconductor chip
404a PLL circuit
407, 408a, 408b wire
409 mold resin
410 BGA pad

PREFERRED MODES

Exemplary Embodiment 1

Figure 2:
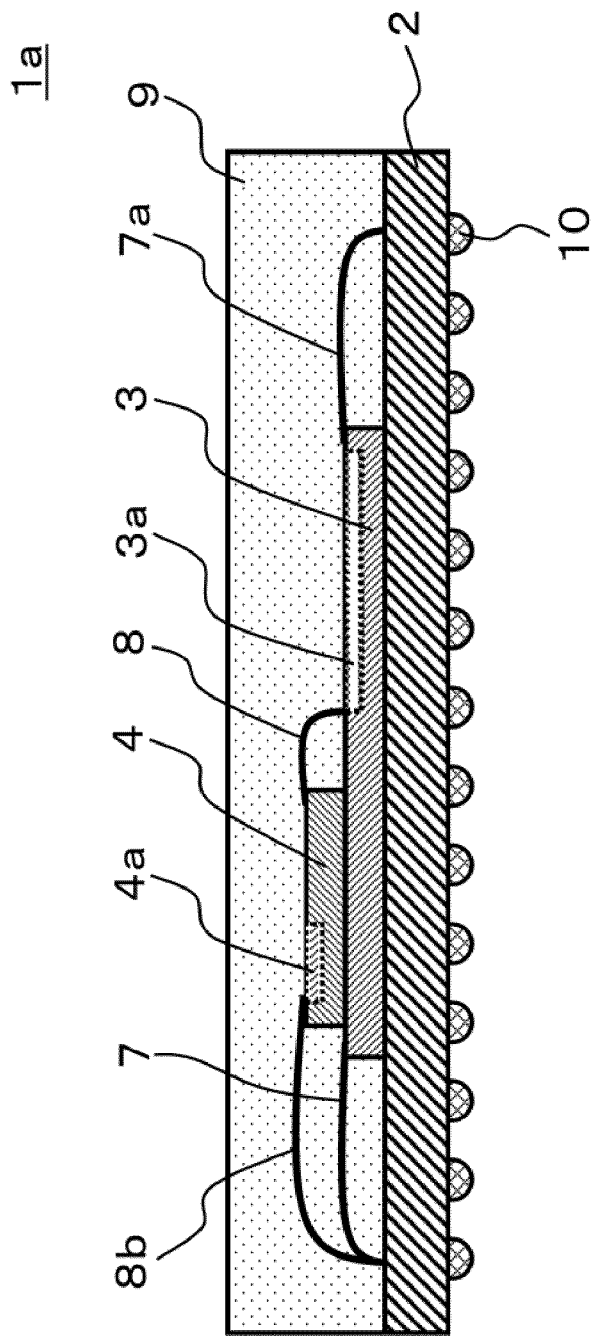
FIG. 2 is a cross-sectional view taken along a line X-X' in FIG. 1, schematically showing a configuration of the semiconductor device according to exemplary embodiment 1 of the present invention.

A semiconductor device according to exemplary embodiment 1 of the present invention is described using the drawings. FIG. 1 is a plan view schematically showing a configuration of the semiconductor device according to exemplary embodiment 1 of the present invention. FIG. 2 is a cross-sectional view of X-X' in FIG. 1, schematically showing a configuration of the semiconductor device according to exemplary embodiment 1 of the present invention.

The semiconductor device 1a has a configuration in which a semiconductor chip 3 is stacked on a substrate 2, and a semiconductor chip 4 is stacked on the semiconductor chip 3. Wires for electrical connection (for example, 7a, 7b) are connected between the semiconductor chip 3 and the substrate 2. Wires for electrical connection (for example, 8a, 8b) are connected between the semiconductor chip 4 and the substrate 2. Wires for electrical connection are connected between the semiconductor chip 3 and the semiconductor chip 4.

The semiconductor chip 3 has a DC/DC converter circuit 3a as a circuit (for example, a switch circuit) that generates noise. The semiconductor chip 4 has a PLL circuit 4a as a circuit (for example, an analog circuit) that easily receives noise. The DC/DC converter circuit 3a is disposed in a region that does not overlap with the semiconductor chip 4, and is disposed in a position diagonally opposite to the PLL circuit 4a so as be separated from the PLL circuit 4a.

The wires 8a and 8b that connect the PLL circuit 4a and the substrate 2 are disposed to the upper left of FIG. 1, and are disposed so as not to cross-(extend)over the DC/DC converter circuit 3a. The wires 7a and 7b that connect the DC/DC converter circuit 3a and the substrate 3a are disposed to the lower right of FIG. 1, corresponding to a position that is diagonally opposite to the wires 8a and 8b related to the PLL circuit 4a.

According to the above type of configuration, since the DC/DC converter circuit 3a and the wires 7a and 7b that are connected to the DC/DC converter circuit 3a are not adjacent to the PLL circuit 4a and the wires 8a and 8b that are connected to the PLL circuit 4a, noise interference between the two circuits is avoided, and it is possible to realize a semiconductor device ensuring a characteristic.

Figure 3:
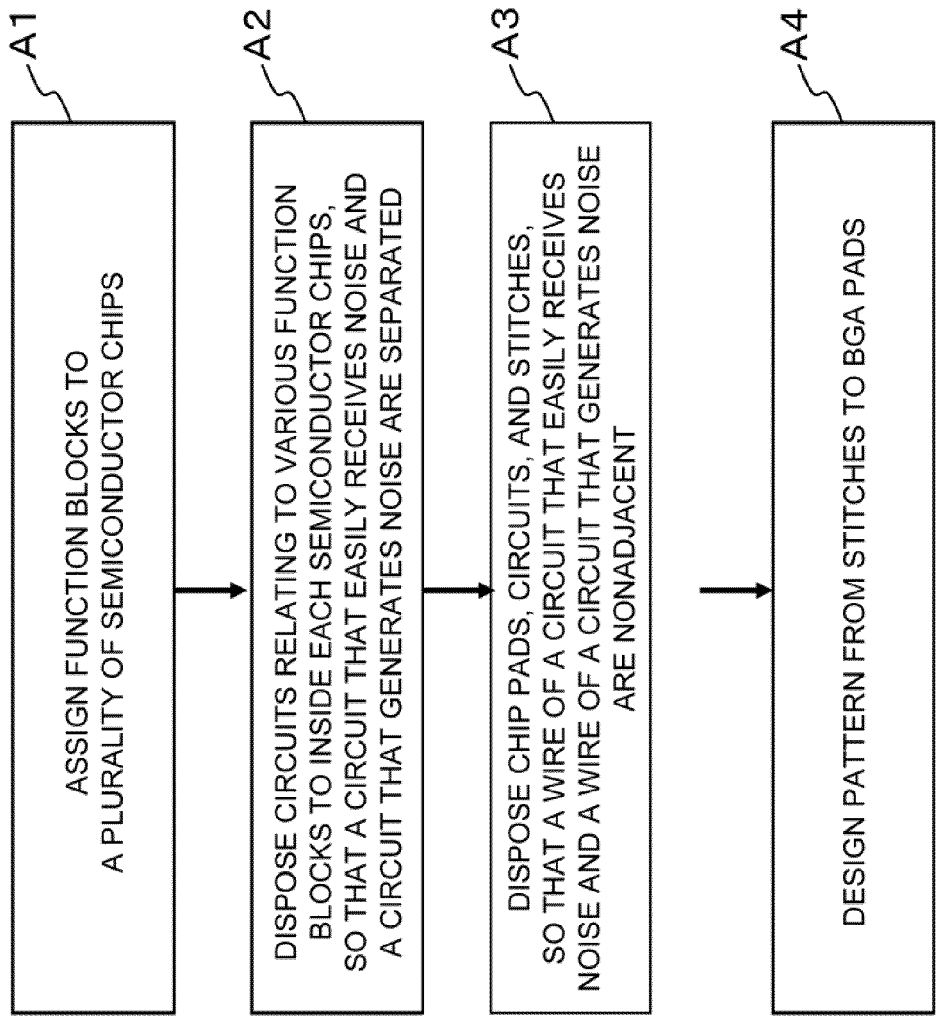
FIG. 3 is a flowchart schematically showing a design sequence for the semiconductor device according to exemplary embodiment 1 of the present invention.

Next, a design sequence for the semiconductor device according to exemplary embodiment 1 of the present invention is described using the drawings. FIG. 3 is a flowchart schematically showing the design sequence for the semiconductor device according to exemplary embodiment 1 of the present invention.

First, from a function block diagram showing the entire semiconductor device, giving consideration to semiconductor processes, circuit area for each function, semiconductor chip area, and the like, the function blocks are assigned to a plurality of semiconductor chips (step A1).

Next, a circuit related to each function block is disposed inside each semiconductor chip, such that a circuit that easily receives noise and a circuit that generates noise are mutually separate (step A2). For example, the circuit that easily receives noise (for example, an analog circuit such as a PLL circuit, an ADC (Analog Digital Converter), a DAC (Digital Analog Converter), or the like) and the circuit that generates noise (for example, a switching circuit such as a DC/DC converter circuit or the like) are disposed to be diagonally opposite or at opposite sides, as in FIG. 1 and FIG. 2.

Next, so that wires of the circuit that easily receives noise and the wires of the circuit that generates noise are nonadjacent, separation is made into wires connecting between semiconductor chips and wires between each semiconductor chip and the substrate, and chip pads (metal pads that bond wires on the semiconductor chips), circuits, and stitches (metal patterns that bond the wires on the substrate) are disposed (step A3).

Finally, patterns are designed from the stitches on the substrate as far as BGA pads (in general, metal pads in which solder balls and the like are mounted, by terminals that connect a semiconductor device to other printed circuit boards) that are disposed on a back side of the substrate (step A4).

By designing the semiconductor device according to this type of design sequence, it is possible to design a semiconductor device in which characteristic deterioration due to noise interference is suppressed.

Next, a method of manufacturing the semiconductor device according to exemplary embodiment 1 of the present invention is described.

First, a sheet form substrate, in which a plurality of pieces of the substrate 2 pieces are arrayed, is prepared, silver paste or resinous die bonding material is applied to a position at which the semiconductor chip 3 is to be mounted, and the semiconductor chip 3 is sequentially mounted here. Or, a die bonding sheet is adhered to a substrate mounting side of the semiconductor chip 3 in advance, and this is mounted sequentially on the substrate 2.

Next, wires (including 7a and 7b) between the semiconductor chip 3 and the substrate 2 are bonded.

Next, a resinous die bonding material is applied to a position at which the semiconductor chip 4 is to be mounted, and this chip 4 is mounted at a prescribed position on the semiconductor chip 3. Or, a die bonding sheet is attached in advance to a back surface of the semiconductor chip 4, and this is mounted at a prescribed position on the semiconductor chip 3.

Next, wires (including 8a and 8b) between the upper and lower semiconductor chips 4 and 3, or between the semiconductor chip 4 and the substrate 2 are bonded.

Next, an assembly of these is sealed with a mold resin 9, the BGA pads 10 formed of solder balls are mounted on the back side of the substrate, and finally cutting into semiconductor device pieces is carried out.

According to exemplary embodiment 1, since the DC/DC converter circuit 3a and the wires 7a and 7b that are connected to the DC/DC converter circuit 3a are not adjacent to the PLL circuit 4a and the wires 8a and 8b that are connected to the PLL circuit 4a, noise interference between the two circuits is avoided, and it is possible to realize a semiconductor device with an assured characteristic.

Exemplary Embodiment 2

Figure 4:
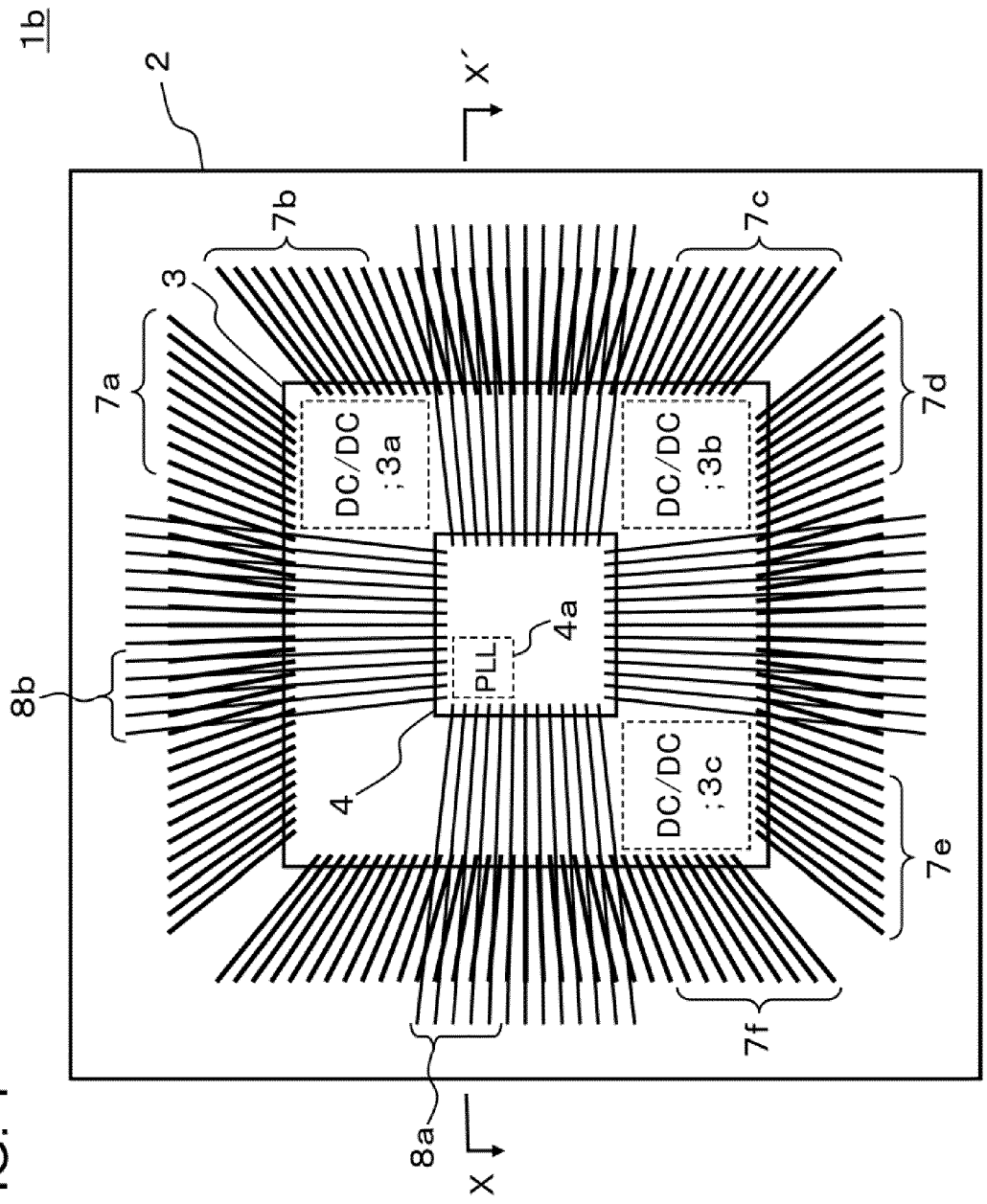
FIG. 4 is a plan view schematically showing a configuration of the semiconductor device according to exemplary embodiment 2 of the present invention.
Figure 5:
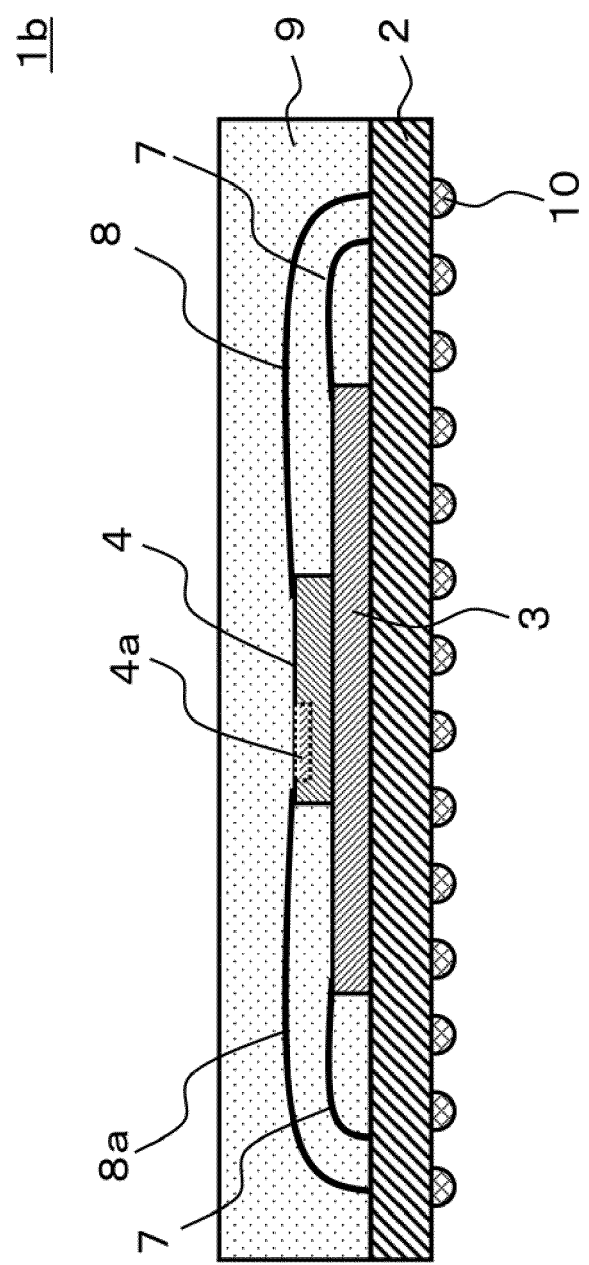
FIG. 5 is a cross-sectional view taken along a line X-X' in FIG. 4, schematically showing a configuration of the semiconductor device according to exemplary embodiment 2 of the present invention.

The semiconductor device according to exemplary embodiment 2 of the present invention is described using the drawings. FIG. 4 is a plan view schematically showing a configuration of the semiconductor device according to exemplary embodiment 2 of the present invention. FIG. 5 is a cross-sectional view taken along a line X-X' in FIG. 4, schematically showing a configuration of the semiconductor device according to exemplary embodiment 2 of the present invention.

A semiconductor device 1b according to exemplary embodiment 2 differs from exemplary embodiment 1 in that an upper layer semiconductor chip 4 is stacked at approximately the center of a lower layer semiconductor chip 3, wires of the semiconductor chip 4 are laid out approximately in parallel at the top, bottom, left, and right of FIG. 4, and DC/DC converter circuits 3a, 3b, and 3c that generate noise are disposed at corners inside the lower layer semiconductor chip 3. According to this structure, the DC/DC converter circuits 3a, 3b, and 3c are disposed at positions that do not overlap wires 8a and 8b that are connected to a PLL circuit 4a of the semiconductor chip 4. Furthermore, the PLL circuit 4a is disposed at a corner of the semiconductor chip 4 at which the DC/DC converter circuits 3a, 3b, and 3c are not disposed, and the disposition is such that the wires 8a and 8b that are connected to the PLL circuit 4a are separated as much as possible from wires 7a to 7f that are connected to the DC/DC converter circuits 3a, 3b, and 3c.

Figure 6:
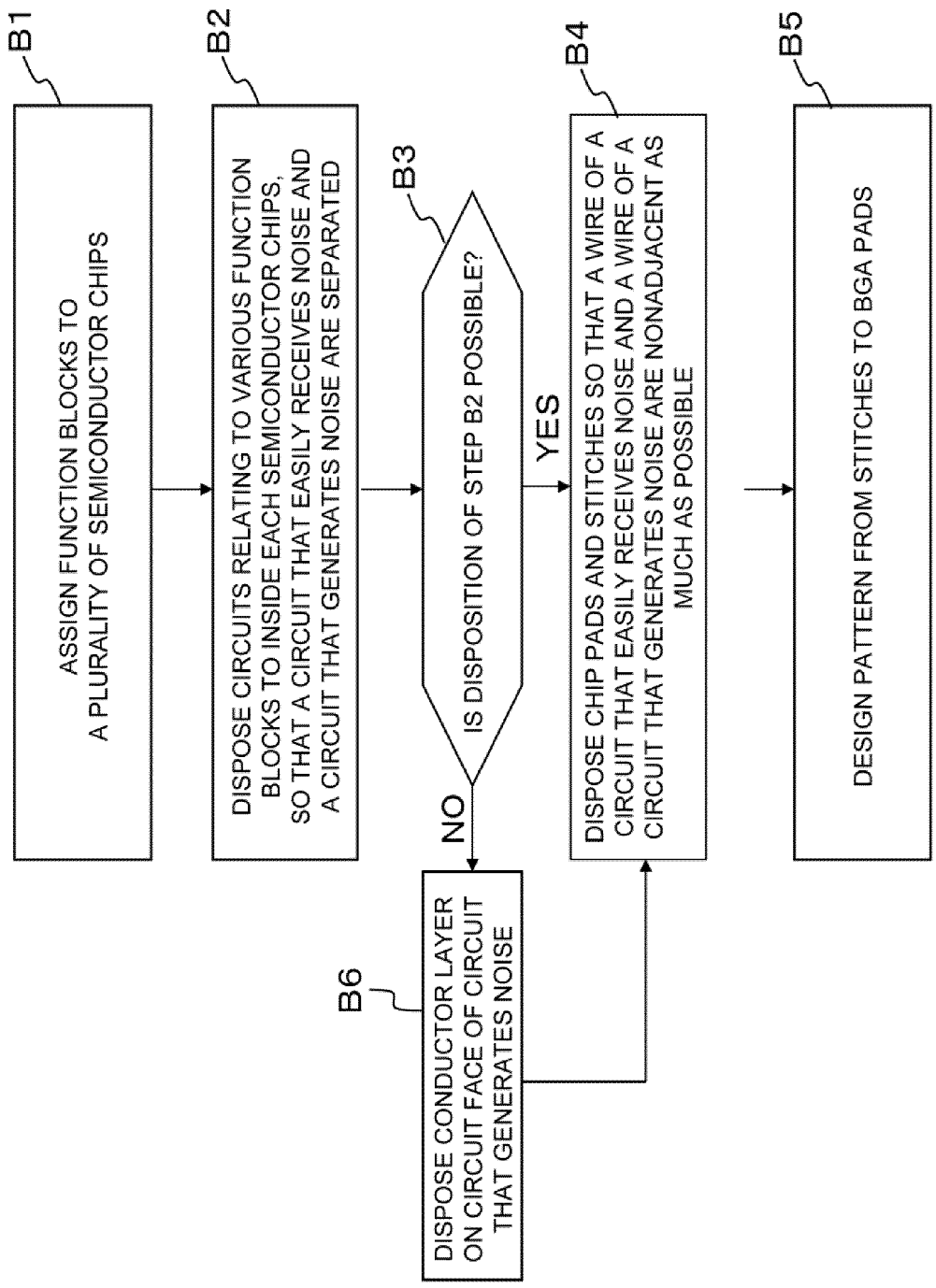
FIG. 6 is a flowchart schematically showing a design sequence for the semiconductor device according to exemplary embodiment 2 of the present invention.

Next, a design sequence of the semiconductor device according to exemplary embodiment 2 of the present invention is described using the drawings. FIG. 6 is a flowchart schematically showing a design sequence for the semiconductor device according to exemplary embodiment 2 of the present invention.

First, from a function block diagram showing the entire semiconductor device, giving consideration to circuit area for semiconductor processes and for each function, semiconductor chip area, and the like, the function blocks are assigned (allocated) to a plurality of semiconductor chips (step B1).

Next, a circuit related to each function block is disposed inside each semiconductor chip, such that a circuit that easily receives noise and a circuit that generates noise are mutually separate (step B2). For example, the circuit that generates noise (for example, a switching circuit such as a DC/DC converter circuit or the like) is disposed in a corner of the semiconductor chip, and a circuit that easily receives noise (for example, an analog circuit such as a PLL circuit, an ADC (Analog Digital Converter), a DAC (Digital Analog Converter), or the like) is disposed at a place separated on average from the circuit that generates noise.

Next, confirmation is made as to whether or not disposition of step B2 is possible (step B3). If the disposition is possible (YES in step B3), chip pads and stitches on a substrate are disposed such that wires of the circuit that easily receives noise and wires of the circuit that generates noise are as much as possible nonadjacent (step B4).

Finally, a pattern is designed from the stitches on the substrate routing to BGA pads disposed on the back side of the substrate (step B5).

Furthermore, a description is given in exemplary embodiment 4 concerning cases where the disposition is not possible (NO in step B3).

By designing the semiconductor device according to this type of design sequence, it is possible to design a semiconductor device in which characteristic deterioration due to noise interference is suppressed.

With regard to a method of manufacturing the semiconductor device 1b according to exemplary embodiment 2, manufacturing is possible by a method almost the same as for the semiconductor device 1a according to exemplary embodiment 1. The only difference is that wires connecting the semiconductor chips are not bonded.

Exemplary Embodiment 3

Figure 7:
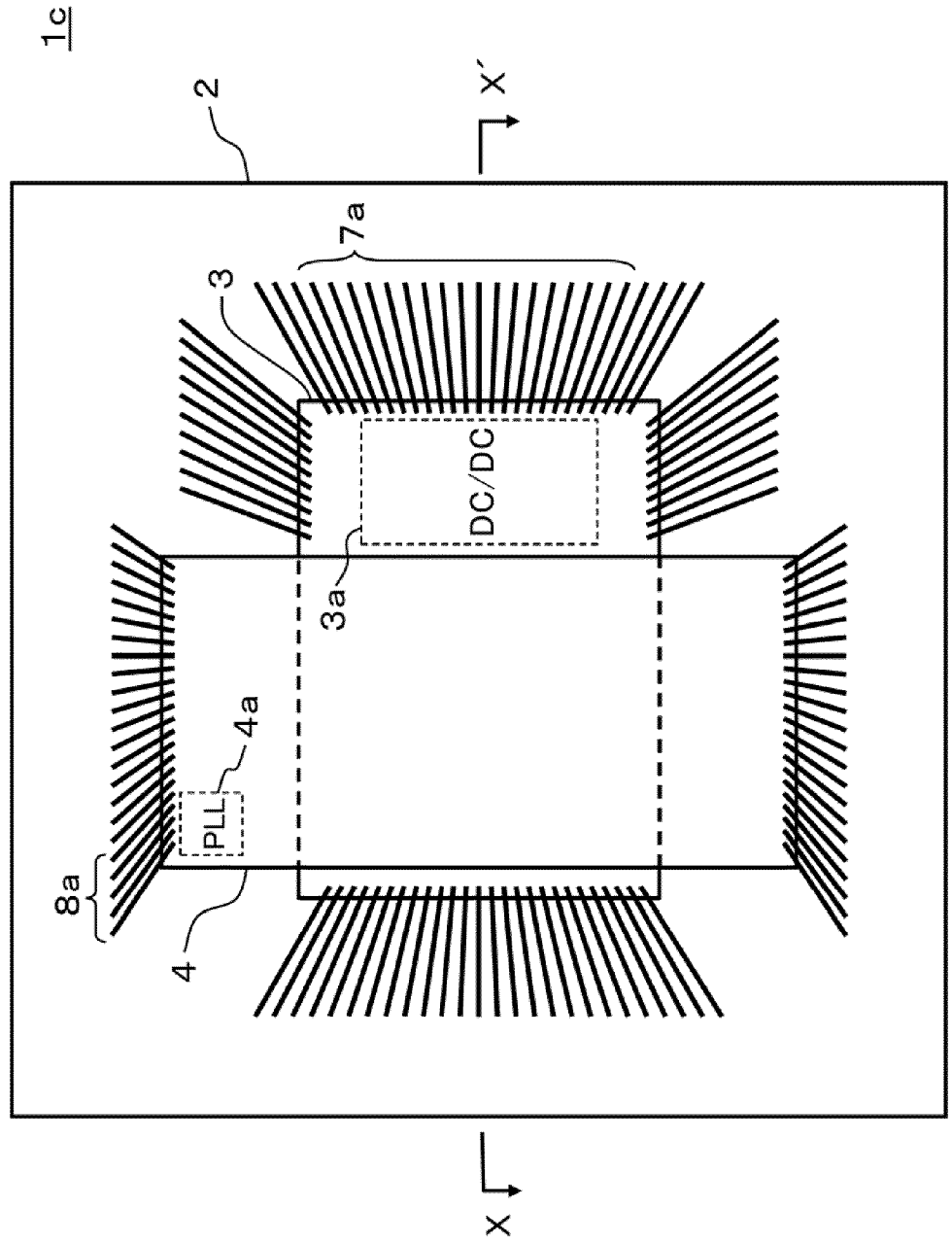
FIG. 7 is a plan view schematically showing a configuration of the semiconductor device according to exemplary embodiment 3 of the present invention.
Figure 8:
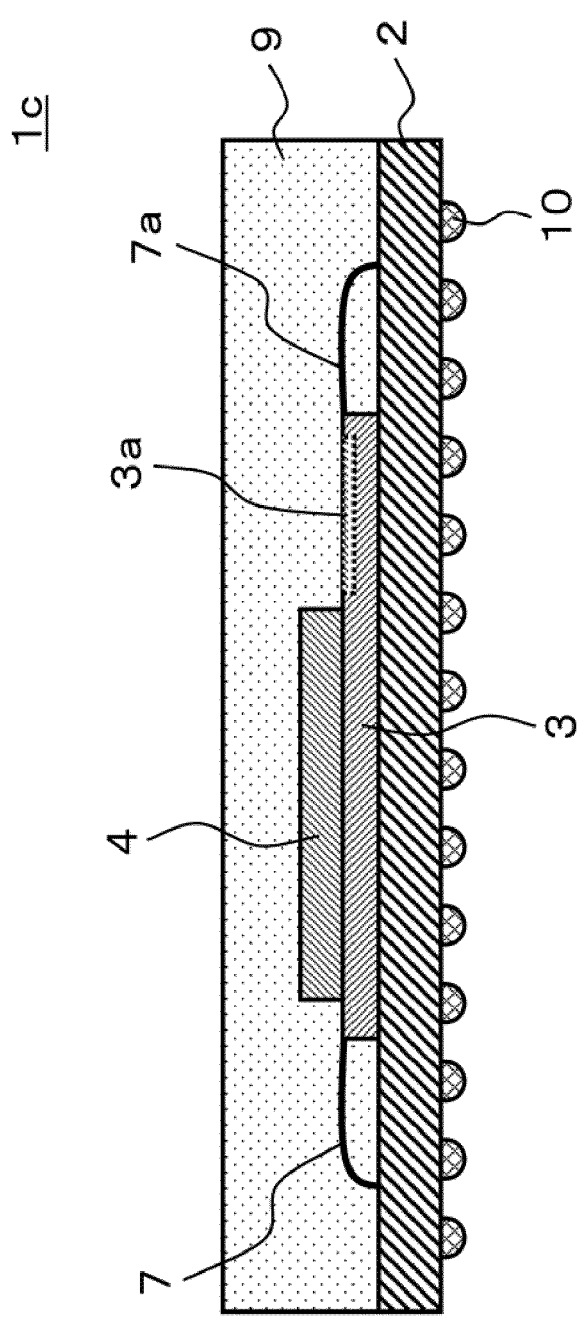
FIG. 8 is a cross-sectional view taken along a line X-X' in FIG. 7, schematically showing a configuration of the semiconductor device according to exemplary embodiment 3 of the present invention.

The semiconductor device according to exemplary embodiment 3 of the present invention is described using the drawings. FIG. 7 is a plan view schematically showing a configuration of the semiconductor device according to exemplary embodiment 3 of the present invention. FIG. 8 is a cross-sectional view taken along a line X-X' in FIG. 7, schematically showing a configuration of the semiconductor device according to exemplary embodiment 3 of the present invention.

In exemplary embodiments 1 and 2, examples have been shown in which the upper layer semiconductor chip 4 is small in comparison to the lower layer semiconductor chip 3, but exemplary embodiment 3 has an example in which an upper layer semiconductor chip 4 is larger than a lower layer semiconductor chip 3. In this way, the upper layer semiconductor chip 4 is stacked at a place outside of a circuit (here, a DC/DC converter circuit) that generates noise inside the lower layer semiconductor chip 3, and a circuit (here, a PLL circuit) that easily receives noise inside this semiconductor chip 4 is disposed at a place separated in a diagonally opposing direction from the circuit that generates noise. Otherwise this configuration is the same as in exemplary embodiments 1 and 2. According to exemplary embodiment 3, an effect similar to that of exemplary embodiment 1 and 2 is obtained.

Exemplary Embodiment 4

Figure 9:
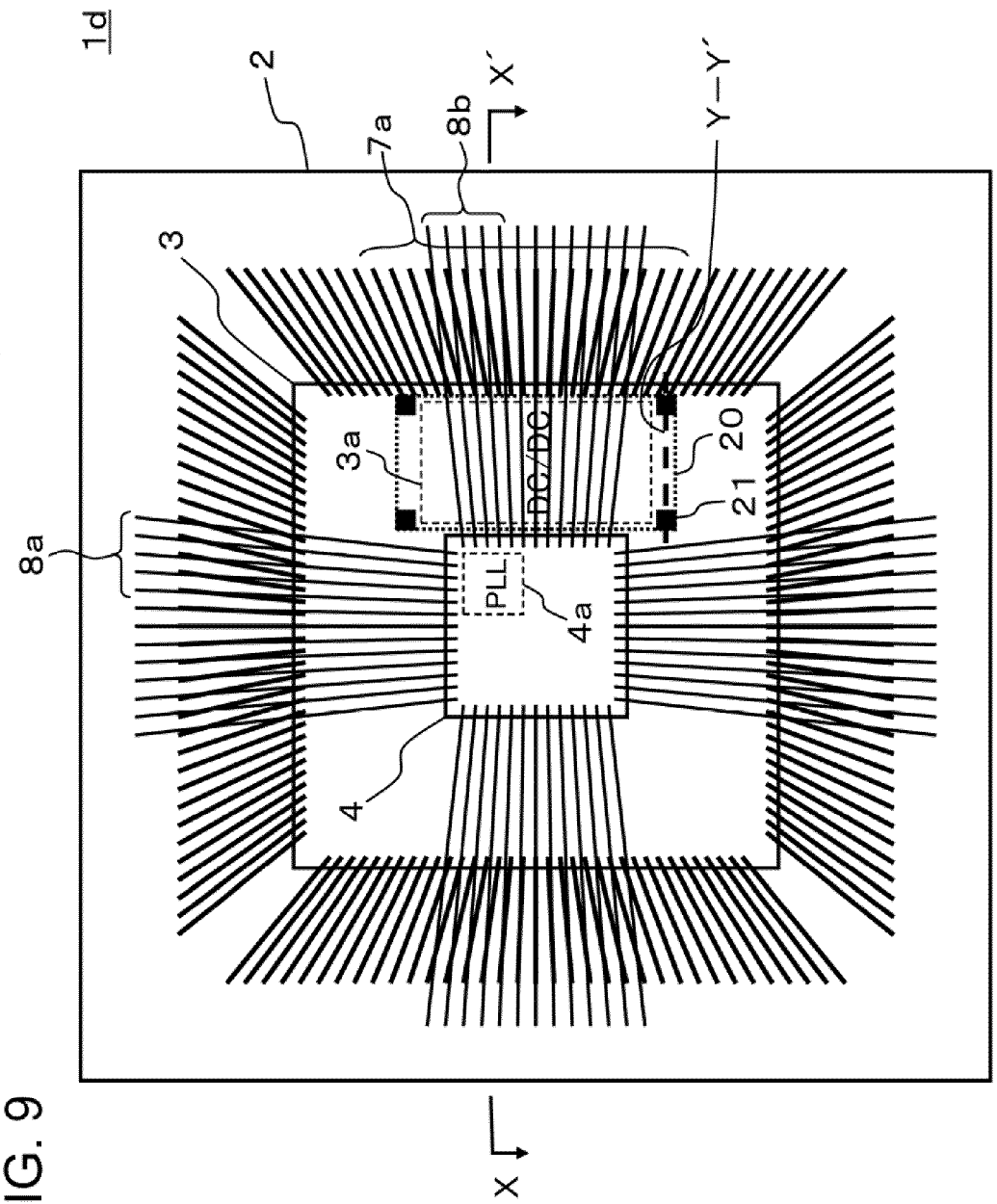
FIG. 9 is a plan view schematically showing a configuration of the semiconductor device according to exemplary embodiment 4 of the present invention.
Figure 10:
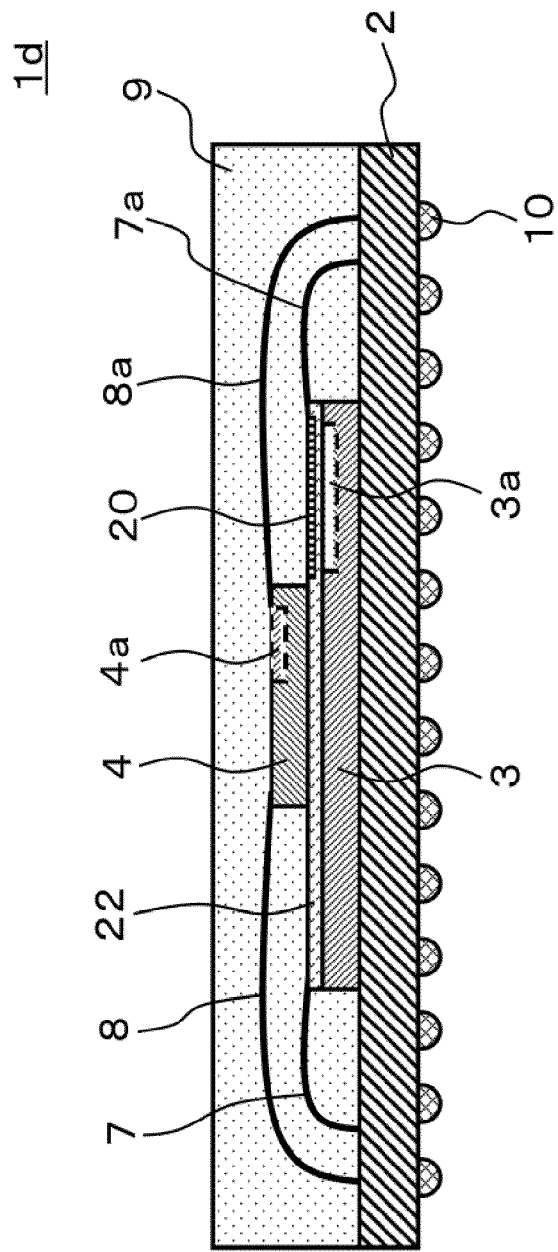
FIG. 10 is a cross-sectional view taken along a line X-X' in FIG. 9, schematically showing a configuration of the semiconductor device according to exemplary embodiment 4 of the present invention.
Figure 11:
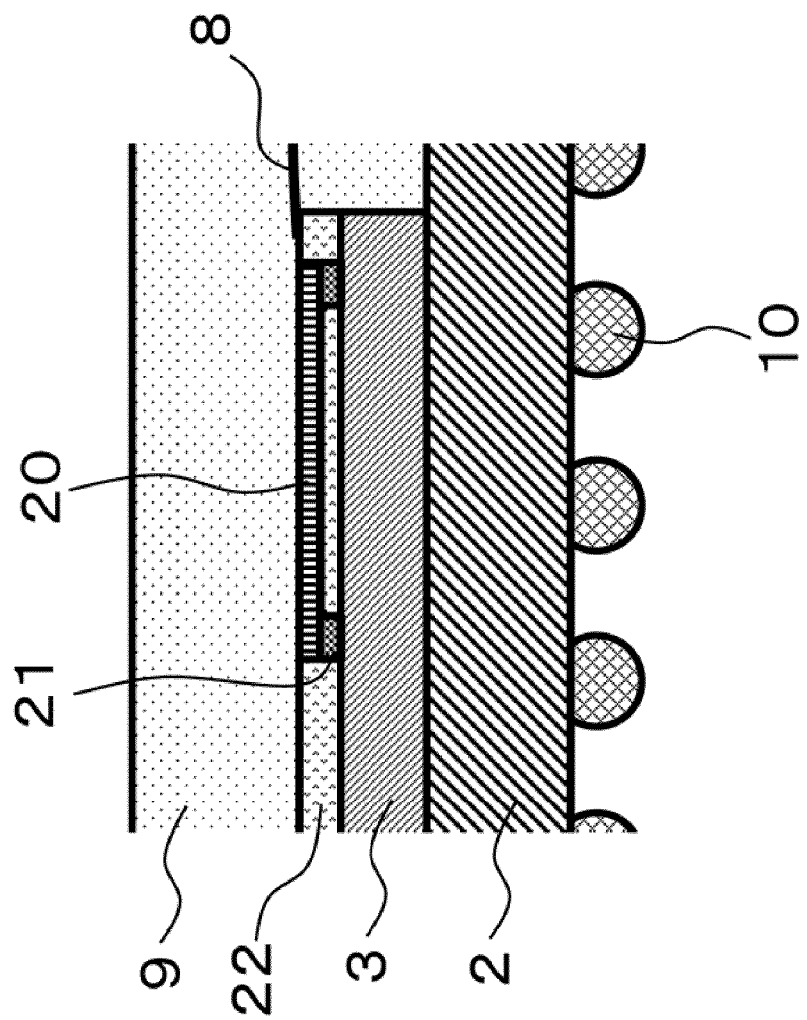
FIG. 11 is an expanded partial cross-sectional view taken along a line Y-Y' in FIG. 9, schematically showing a configuration of the semiconductor device according to exemplary embodiment 4 of the present invention.

The semiconductor device according to exemplary embodiment 4 of the present invention is described using the drawings. FIG. 9 is a plan view schematically showing a configuration of the semiconductor device according to exemplary embodiment 4 of the present invention. FIG. 10 is a cross-sectional view taken along a line X-X' in FIG. 9, schematically showing a configuration of the semiconductor device according to exemplary embodiment 4 of the present invention. FIG. 11 is a cross-sectional view taken along a line Y-Y' in FIG. 9, schematically showing a configuration of the semiconductor device according to exemplary embodiment 4 of the present invention.

Exemplary embodiment 4 differs from exemplary embodiments 1 and 2 in having a structure in which a semiconductor chip 4, on which a PLL circuit 4a that easily receives noise is mounted, is disposed on a semiconductor chip 3 in a region that does not overlap a DC/DC converter circuit 3a that generates noise; wires 8b connected to the PLL circuit 4a extend over (cross-over) the DC/DC converter circuit 3a; a conductor layer 20 is arranged between the DC/DC converter circuit 3a and the wires 8b, so as to cover the DC/DC converter circuit 3a; and noise interference from the DC/DC converter circuit 3a to the wires 8b of the PLL circuit 4a is prevented as much as possible. In other points this configuration is the same as in exemplary embodiments 1 and 2.

The conductor layer 20 is arranged interposed with an insulating layer 22 on the semiconductor chip 3 and is electrically connected to ground of the DC/DC converter circuit 3a of the semiconductor chip 3, through connecting vias 21 that pass through the insulating layer 22. In exemplary embodiment 4, these connecting vias 21 are arranged at 4 corner locations of the conductor layer 20. By arranging the connecting vias 21 in 4 locations at least, it is possible to confine noise generated by the DC/DC converter circuit 3a to below the conductor layer 20.

Next, a design sequence of the semiconductor device according to exemplary embodiment 4 of the present invention is described using the drawings. Here, FIG. 6 of exemplary embodiment 2 is used.

First, from a function block diagram showing the entire semiconductor device, giving consideration to circuit area for semiconductor processes and for each function, semiconductor chip area, and the like, the function blocks are assigned to a plurality of semiconductor chips (step B1).

Next, a circuit related to each function block is disposed inside each semiconductor chip, such that a circuit that easily receives noise and a circuit that generates noise are mutually separate (step B2). For example, as shown in FIG. 9 and FIG. 10, the circuit that generates noise (for example, a switching circuit such as a DC/DC converter circuit or the like) is disposed in a corner of the semiconductor chip, and a circuit that easily receives noise (for example, an analog circuit such as a PLL circuit, an ADC (Analog Digital Converter), a DAC (Digital Analog Converter), or the like) is disposed at a place separated from the circuit that generates noise.

Next, confirmation is made as to whether or not disposition of step B2 is possible (step B3). In a case where the disposition is not possible (NO in step B3), a conductor layer is disposed on a circuit face of the circuit that generates noise (step B6). Furthermore, in example of FIG. 9 and FIG. 10, since it was not possible to dispose the circuit that generates noise and the circuit that easily receives noise at separate places, the confirmation of step B3 is NO.

Next, chip pads and stitches on a substrate are disposed such that wires of the circuit that easily receives noise and wires of the circuit that generates noise are nonadjacent as much as possible. (step B4).

Finally, a pattern is designed from the stitches on the substrate routing to BGA pads disposed on the back side of the substrate (step B5).

By designing the semiconductor device according to this type of design sequence, it is possible to design a semiconductor device in which characteristic deterioration due to noise interference is suppressed as much as possible.

Furthermore, in cases in which the disposition is possible (YES in step B3), reference should be made to exemplary embodiment 2.

Next, a method of manufacturing the semiconductor device according to exemplary embodiment 4 of the present invention is described.

In the method of manufacturing the semiconductor device according to exemplary embodiment 4, different from exemplary embodiments 1 and 2, before assembly of the semiconductor device described in the method of manufacturing the semiconductor device according to exemplary embodiment 1, for a wafer state of the semiconductor chip 3, it is necessary to form the conductor layer 20 and the connecting vias 21 on the circuit face. Normally, in a final manufacturing process of a semiconductor wafer, a passivation film for circuit protection is disposed on a circuit face of the semiconductor wafer, and aluminum pads of pad portions that bond wires and pad portions for testing are opened. In exemplary embodiment 4, before forming the passivation film for these, in a wiring layer formation process of the semiconductor wafer, first, the connecting vias 21 and the conductor layer 20 are formed in copper or aluminum (step C1). After that, the passivation film, in which an inorganic insulator and an organic insulator (for example, polyimide) are stacked sequentially from a lower layer, is formed (step C2). Next, desired openings are provided in the passivation film formed from an organic insulator (step C3). In this regard, if the passivation film formed from the organic insulator is photosensitive, the openings are disposed by patterning thereof, and if non-photosensitive, patterning of a photosensitive resist is carried out, and with this as a mask, openings are provided by wet etching, dry etching, or the like. Finally, with the passivation film formed from an organic insulator as a mask, the passivation film formed of the inorganic insulator of opening parts is removed, and the aluminum pads are exposed (step C4). In a case where, in this wiring layer formation process, a wide continuous pattern (the conductor layer 20) as in FIG. 9 cannot be formed, a wide pattern that can be realized in this formation process is formed in a mesh form.

There are also other methods for the wiring layer formation for the semiconductor wafer. In the semiconductor wafer in which the passivation film or the aluminum pads are already formed, first, a sputter layer formed from a material selected from copper (Cu), palladium (Pd), gold (Au), platinum (Pt), aluminum (Al), or the like, or an alloy thereof, forming a plating power supply layer, is formed on the semiconductor wafer after providing a substrate sputter film formed from a material selected from titanium (Ti), tungsten (W), molybdenum (Mo), tantalum (Ta), vanadium (V), chromium (Cr), nickel (Ni), or the like, or an alloy thereof (step D1). From a cost or performance point of view, copper is preferable for the power supply layer, and Ti is preferable for the substrate sputter film. Next, a plating resist film is formed, and the conductor layer 20, the connecting vias 21, and a pattern with openings in a portion corresponding to pads for wire bonding and the like, are formed (step D2). Next, a material selected from copper, gold, nickel, and alloys thereof, is precipitated in electrolytic plating in the opening parts of the plating resist (step D3). From a workability or cost point of view, copper is preferable. Next, a new plating resist film is formed and a desired pattern is formed as a connection terminal (step D4). Next, continuous plating of electrolytic nickel and gold plating is performed on the opening parts of the plating resist, and a connection terminal of gold is formed on a surface (step D5). Finally, the plating resist is removed, and the conductor layer and the aluminum pads are formed by wet etching or dry etching of the sputter film (step D6).

There are also other methods for the wiring layer formation for the semiconductor wafer. In a case of using a semiconductor wafer without a passivation film, first, an insulating layer is formed on aluminum wiring or copper wiring (step E1). Next, connecting vias are formed in the insulating layer (step E2). In a case where the insulating layer is a photosensitive resin, the connecting vias are formed by a photolithographic method. In a case where the insulating layer is a non-photosensitive resin, the connecting vias are formed by a laser method, a dry etching method using another mask, a wet etching method, or a blasting method. Alternatively, a method is selected in which metal posts are provided at positions that form connecting vias on the aluminum wiring or copper wiring, and after forming an insulating film, by polishing these, the metal posts are exposed. After this, it is possible to form the connecting vias and the conductor layer, in a semiconductor wafer state, by step D1 to step D6.

After providing the conductor layer and the connecting vias as above, cutting into semiconductor chip pieces is carried out, and manufacturing is performed by a method the same as exemplary embodiments 1 and 2.

According to exemplary embodiment 4, even if wiring connected to each circuit is disposed above the circuit that generates noise and the circuit that easily receives noise, since the conductor layer 20 is formed above these circuits, there is little characteristic deterioration by mixing in of noise. At the same time, since the conductor layer 20 covers only specific circuit(s), due to this conductor layer 20 there is no noise interference from the specific circuit(s) to other circuits inside the same semiconductor chip, and there is no noise interference from other circuit(s) to specific circuits inside the same semiconductor chip.

Exemplary Embodiment 5

Figure 12:
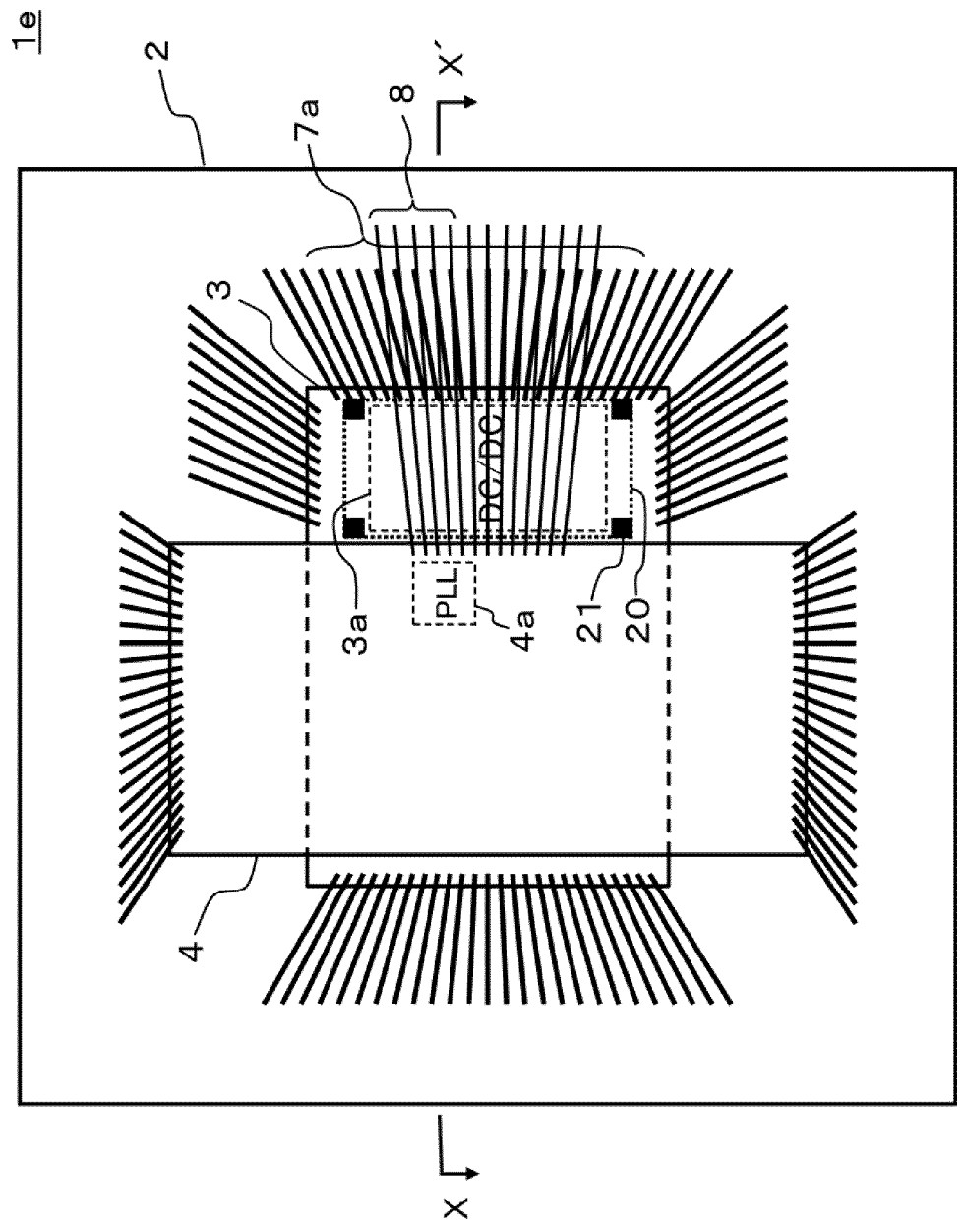
FIG. 12 is a plan view schematically showing a configuration of the semiconductor device according to exemplary embodiment 5 of the present invention.
Figure 13:
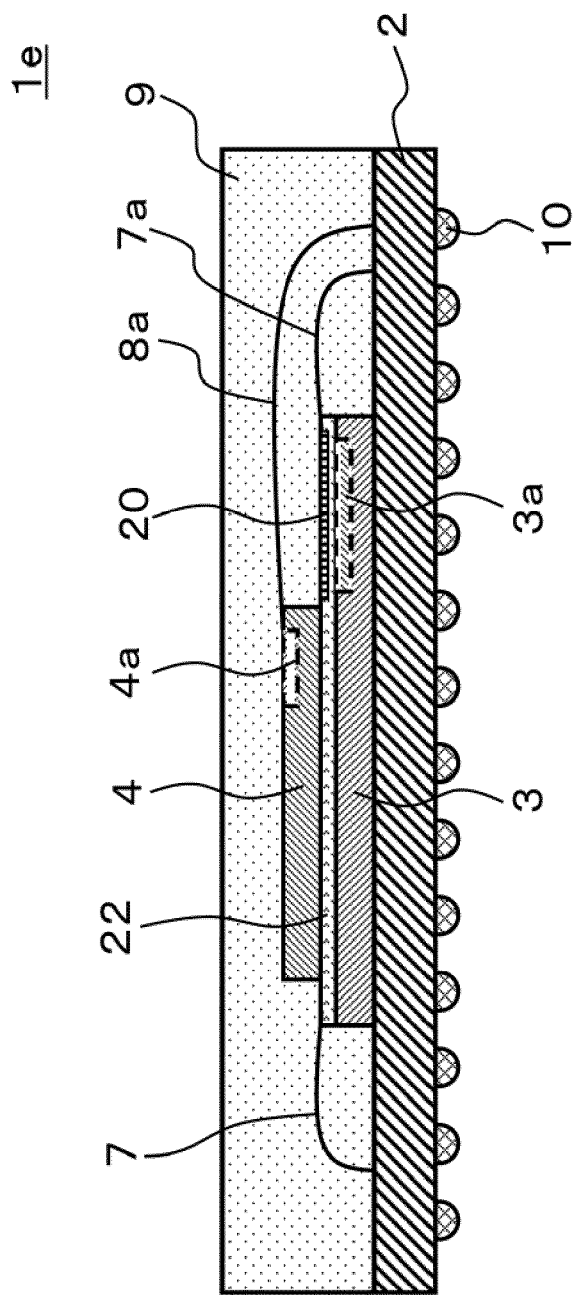
FIG. 13 is a cross-sectional view taken along a line X-X' in FIG. 12, schematically showing a configuration of the semiconductor device according to exemplary embodiment 5 of the present invention.
Figure 16:
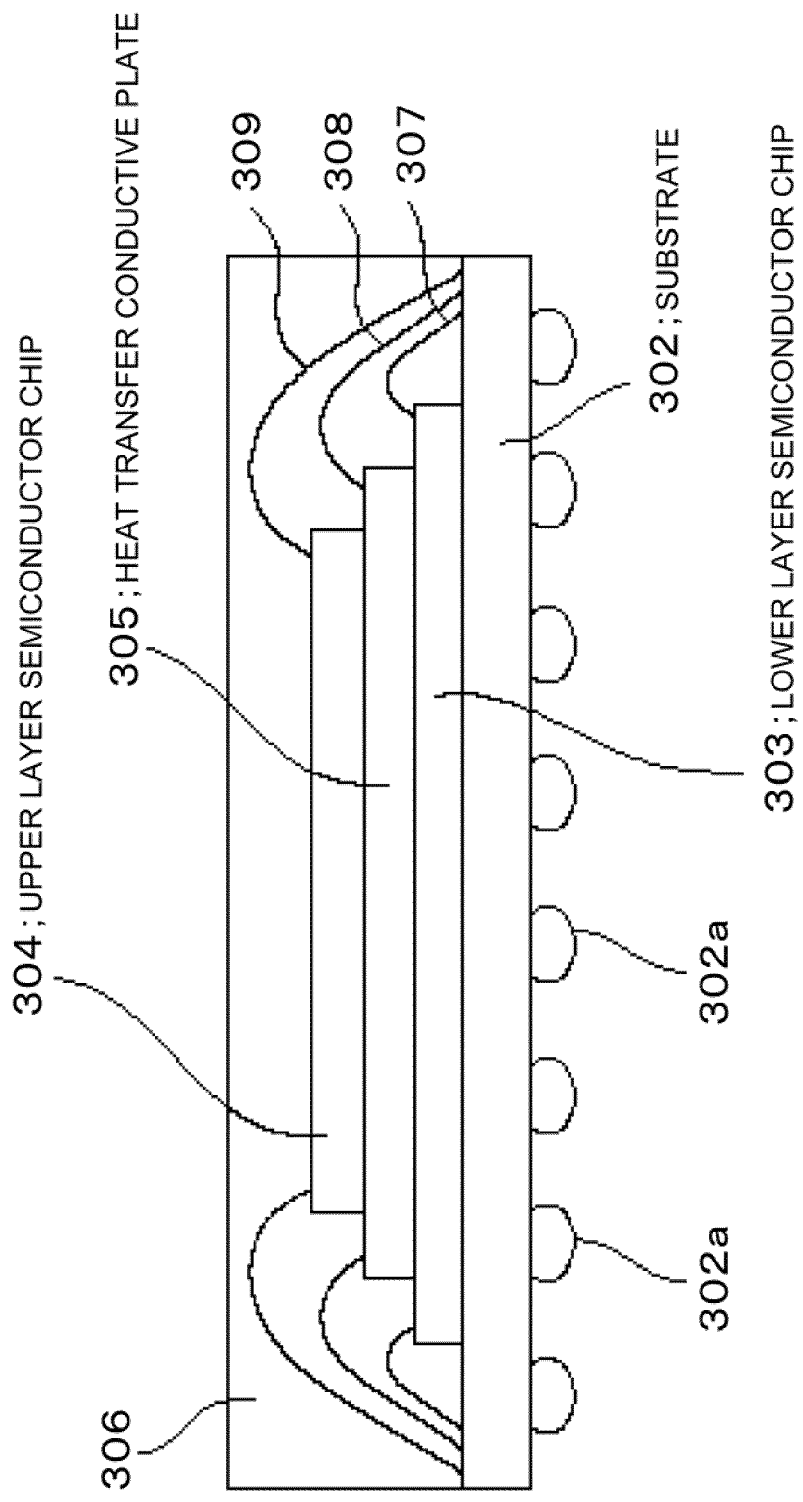
FIG. 16 is a cross-sectional view schematically showing a configuration of the semiconductor device according to related art 3.
Figure 17:
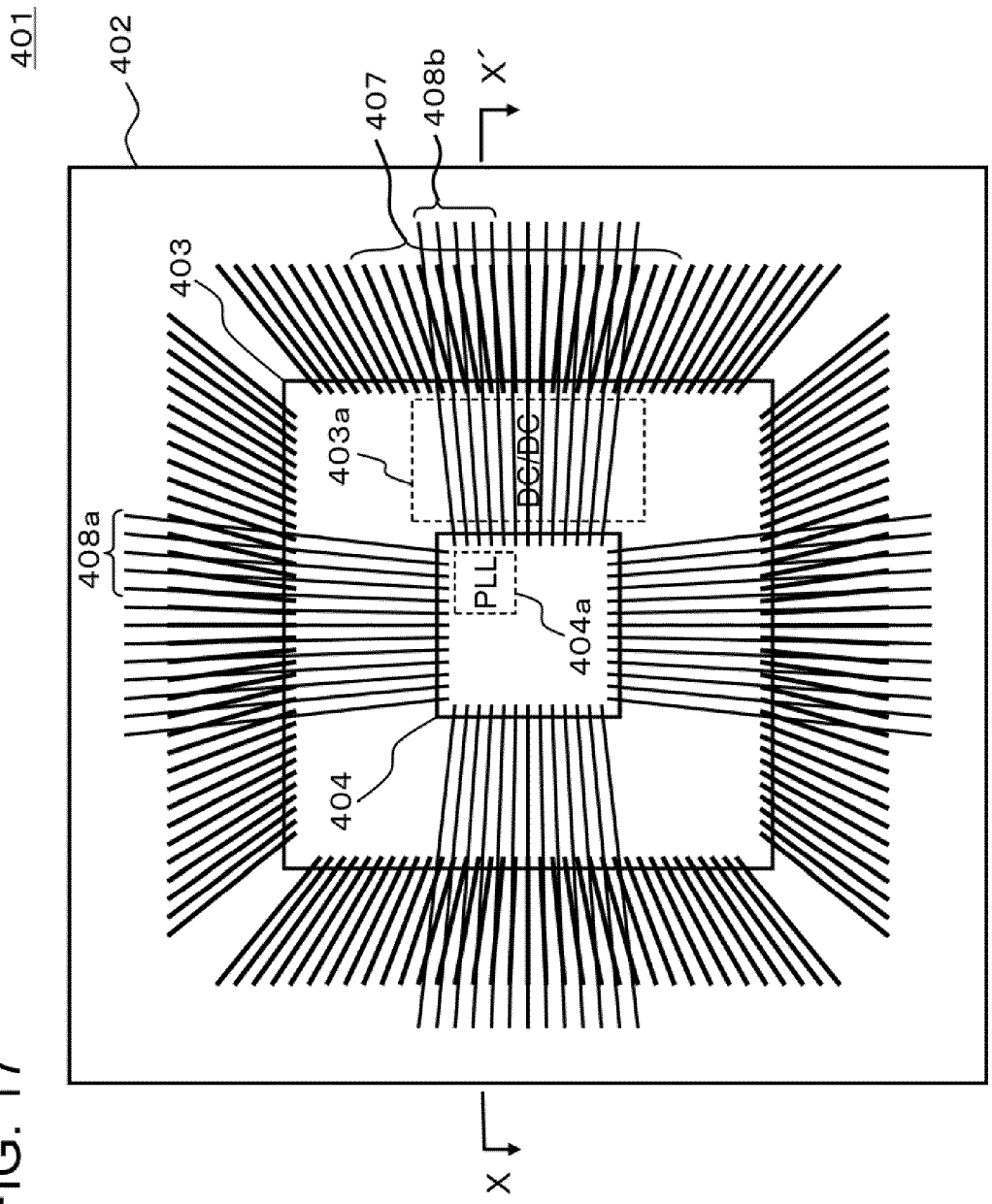
FIG. 17 is a plan view schematically showing a configuration of the semiconductor device according to a reference case.
Figure 18:
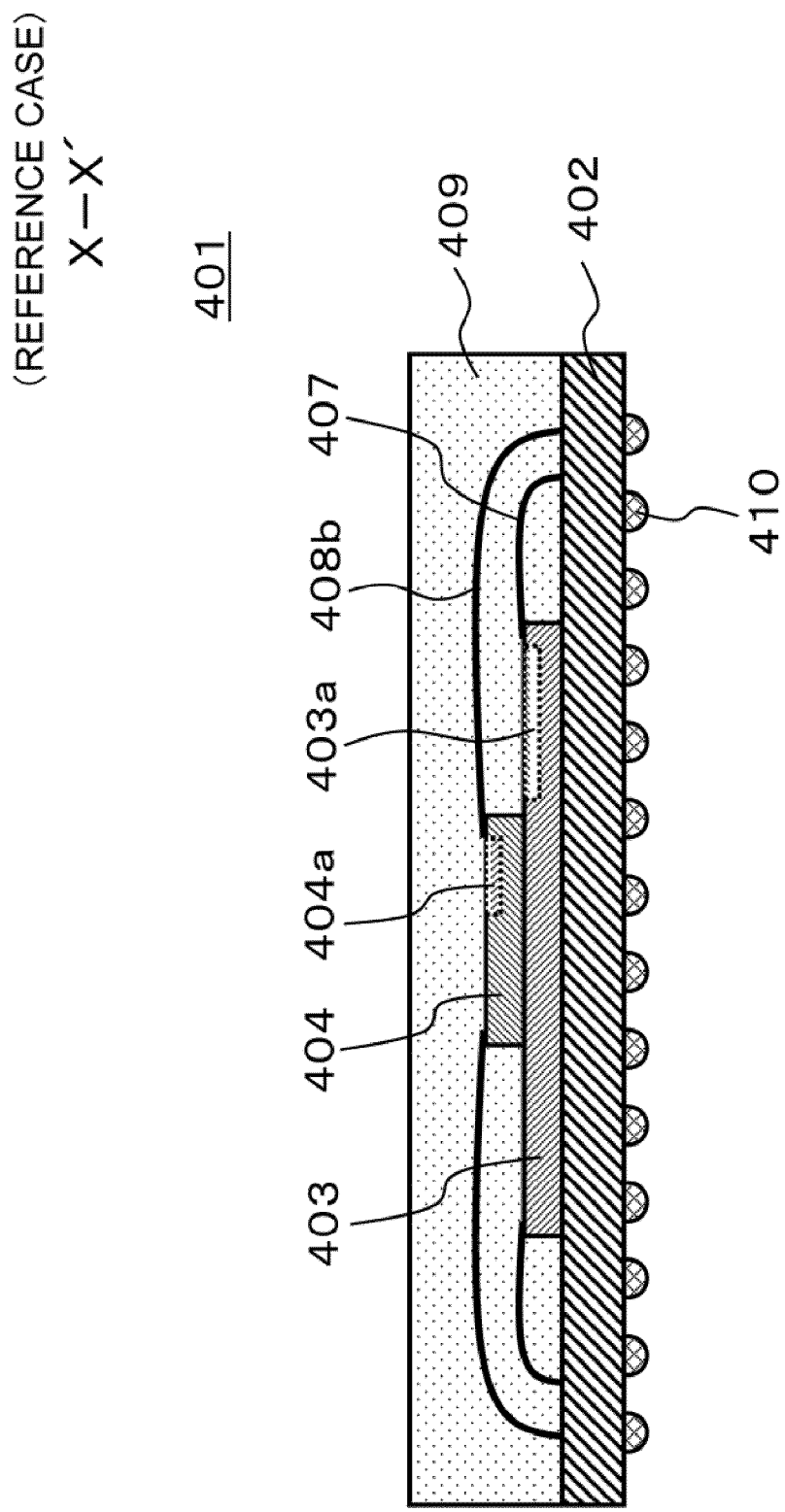
FIG. 18 is a cross-sectional view taken along a line X-X' in FIG. 17, schematically showing a configuration of the semiconductor device according to a reference case.

The semiconductor device according to exemplary embodiment 5 of the present invention is described using the drawings. FIG. 12 is a plan view schematically showing a configuration of the semiconductor device according to exemplary embodiment 5 of the present invention. FIG. 13 is a cross-sectional view taken along a line X-X' in FIG. 12, schematically showing the configuration of the semiconductor device according to exemplary embodiment 5 of the present invention.

Exemplary embodiment 4 was an example in which the upper layer semiconductor chip 4 is smaller than the lower layer semiconductor chip 3, but exemplary embodiment 5 is an example in which the upper layer semiconductor chip 4 is larger. In this type of case also, in a case where wires of a circuit (here, a PLL circuit) that easily receives noise extends over (cross-over) a circuit (here, a DC/DC converter circuit) that generates noise, a conductor layer 20 is formed on an upper face of the circuit that generates noise. Otherwise this configuration is the same as in exemplary embodiment 4. According to exemplary embodiment 5, an effect similar to that of exemplary embodiment 4 is obtained.

Furthermore, in exemplary embodiments 1 to 5, the DC/DC converter circuit as the circuit that generates noise was taken as an example, but the present invention is not limited thereto. A reason that the DC/DC converter circuit was assumed as the circuit that generates noise is that, in order to generate a desired DC voltage, a switching operation with a frequency of from about several tens of kHz to about several tens of MHz is carried out, and accompanying this switching a large voltage fluctuation or a current fluctuation produces noise. As a result, all circuits that perform a switching operation accompanied by a large voltage fluctuation or current fluctuation are targeted. Furthermore, there is a tendency in recent digital circuits for power supply voltage to be low, of the order of 1V, but conversely there is a tendency for current to increase. In particular, since a large current flows in a power supply that is a supply path of current necessary for circuit operation, and to ground, wires connected to a power supply/ground of a digital circuit that performs a switching operation may be a noise generation source that is assumed here. Furthermore, in a high speed digital circuit, an I/O circuit differs from an internal circuit and is a switching circuit in which a large current flows. These in particular are dominating noise generation sources.

Furthermore, in exemplary embodiments 1 to 5, the PLL circuit as the circuit that easily receives noise was taken as an example, but the present invention is not limited thereto. A reason that the PLL circuit was assumed as the circuit that easily receives noise is that, in a case where noise is mixed into an input terminal, a power supply terminal, and a ground terminal of the PLL circuit, output of the PLL circuit fluctuates due to this noise. In particular, a case where a frequency component included in the noise matches the frequency of the circuit assumed here, and a case where the frequency component is included in the most important frequency range with regard to the assumed circuit characteristic, become problematic. For example, in a case where the frequency of a signal generated in the PLL circuit is several tens of MHz, if a large noise of a frequency range the same as this is mixed in, a reference signal that should properly be generated changes. Furthermore, in a case of a DAC circuit in a speech range, since a S/N (Signal to Noise Ratio) in a range of from several Hz to several tens of kHz becomes problematic, if noise of this frequency component is mixed-in, the S/N deteriorates. Furthermore, the same can be said for an ADC circuit. In addition, the same can be said for an RF circuit, for example, a Low Noise Amplifier (LNA), in which a coil or a capacitor is formed by a pattern on a semiconductor chip.

Furthermore, in exemplary embodiments 1 to 5, a description was given of cases in which wires of the circuit that easily receives noise extends over the circuit that generates noise, but the circuit that generates noise and the circuit that easily receives noise may be reversed. The reason for this is that in either case the wires work as a noise propagation route. For example, in an LNA circuit in which a coil or a capacitor is formed by a pattern on a semiconductor chip, if the wires extend over the LNA circuit, noise is directly mixed from the wires into the coil or the capacitor, and the S/N of an output signal of the LNA circuit decreases.

Furthermore, in exemplary embodiments 1 to 5, examples were shown in which the circuit that easily receives noise and the circuit that generates noise were formed in respective semiconductor chips, but the circuit that easily receives noise and the circuit that generates noise may exist together within one semiconductor chip. In particular, in exemplary embodiments 4 and 5, an effect is manifested in cases in which the abovementioned circuits exist together. As indicated in the above described paragraphs [0016] to [0017], in such cases, by not providing a conductor region on the entire semiconductor chip surface, and by forming a conductor layer on a specific circuit(s) as in exemplary embodiments 4 and 5, it is possible to avoid the noise interference inside the same semiconductor chip.

Furthermore, in exemplary embodiments 4 and 5, an example was described in which the conductor layer 20 is connected to ground of its covering circuit (the DC/DC converter circuit 3a in exemplary embodiments 4 and 5), but this conductor layer 20 may be connected to a guard ring formed in a periphery of its covering circuit. Here, the guard ring is a wall that separates the circuit that easily receives noise and the circuit that generates noise inside the same semiconductor chip, within a silicon substrate (Non-Patent Document: Kosaka, et al., "Substrate Coupling Strategy in COMS Mixed Signal/RF Circuit", Shingaku Gihou (Communications Society Technical Report), SDM 2005-136, August, 2005, pp. 49-53). By connecting the conductor layer 20 to the guard ring that has little noise, it is possible to separate the noise.

INDUSTRIAL APPLICABILITY

According to the present invention, in a semiconductor device which combines different types of chips, such as an analog chip, a digital chip, an RF chip, a power supply chip, or the like, and in particular in a semiconductor device in which, by stacking a semiconductor chip that easily generates noise and a semiconductor chip that easily receives noise, maintenance of characteristic is difficult, it is possible to realize a semiconductor device with little deterioration of its characteristic. For example, application is possible to a semiconductor device in which a sound source type of digital chip and an audio type of analog chip are stacked, a semiconductor device in which a power supply type of high voltage analog chip and a low voltage digital chip such as a microcomputer are stacked, a semiconductor device in which an RF high sensitivity analog chip and a control digital chip are stacked, and the like.

Modifications and adjustments of embodiments and examples are possible within the bounds of the entire disclosure (including the scope of the claims) of the present invention, and also based on fundamental technological concepts thereof. Furthermore, a wide variety of combinations and selections of various disclosed elements are possible within the scope of the claims of the present invention.

What is claimed is:

1. A semiconductor device comprising:
a plurality of semiconductor chips that are stacked, and that include a first semiconductor chip and a second semiconductor chip, said first semiconductor chip stacked within a region on said second semiconductor chip;
a first circuit that generates noise, and that is disposed within said second semiconductor chip outside said region on said second semiconductor chip said first circuit having a first wire;
a second circuit that receives noise, is disposed within said first semiconductor chip, and is disposed so as to be separated from said first circuit said second circuit having a second wire that is disposed so as not to run in parallel to said first wire of said first circuit,
wherein said first circuit that generates noise comprises a switching circuit,
wherein said second circuit that receives noise comprises an analog circuit.

2. A semiconductor device comprising:
a plurality of semiconductor chips that are stacked, and that include a first semiconductor chip and a second semiconductor chip, said first semiconductor chip stacked within a region on said second semiconductor chip;
a first circuit that generates noise, and that is disposed within said second semiconductor chip outside said region on said second semiconductor chip, said first circuit having a first wire;
a second circuit that receives noise, is disposed within said first semiconductor chip, and is disposed so as to be separated from said first circuit, said second circuit having a second wire that is disposed in a diagonally opposing direction with respect to said first wire,
wherein said first circuit that generates noise comprises a switching circuit,
wherein said second circuit that receives noise comprises an analog circuit.

3. A semiconductor device comprising:
a plurality of semiconductor chips that are stacked, and that include a first semiconductor chip and a second semiconductor chip, said first semiconductor chip stacked within a region on said second semiconductor chip;
a first circuit that generates noise, and that is disposed within said second semiconductor chip outside said region on said second semiconductor chip, said first circuit having a first wire;
a second circuit that receives noise, is disposed within said first semiconductor chip, and is disposed in a position diagonally opposing said first circuit, said second circuit having a second wire that is disposed in a diagonally opposing direction with respect to said first wire,
wherein said first circuit that generates noise comprises a switching circuit,
wherein said second circuit that receives noise comprises an analog circuit.

4. The semiconductor device according to claim 1, wherein
a circuit that easily receives noise within said first semiconductor chip is disposed so as to be separated from said circuit that generates noise, and
a wire of said circuit that easily receives noise is disposed so as not to run in parallel to a wire of said circuit that generates noise.

5. The semiconductor device according to claim 1, wherein
a third semiconductor chip is stacked in a region, on a second semiconductor chip, in which a circuit that easily receives noise is not disposed within said second semiconductor chip, and
a wire of a circuit that generates noise within said third semiconductor chip is disposed so as not to extend over said circuit that easily receives noise.

6. The semiconductor device according to claim 1, wherein
a third semiconductor chip is stacked in a region, on a second semiconductor chip, in which a circuit that easily receives noise is not disposed within said second semiconductor chip, and
a wire of a circuit that generates noise within said third semiconductor chip is disposed in a diagonally opposing direction with respect to a wire of said circuit that easily receives noise.

7. The semiconductor device according to claim 1, wherein
a third semiconductor chip is stacked in a region, on a fourth semiconductor chip, in which a circuit that easily receives noise is not disposed within said fourth semiconductor chip,
a circuit that generates noise within said third semiconductor chip is disposed in a position diagonally opposing said circuit that easily receives noise, and
a wire of said circuit that generates noise is disposed in a diagonally opposing direction with respect to a wire of said circuit that easily receives noise.

8. The semiconductor device according to claim 1, wherein
a third semiconductor chip is stacked in a region, on a fourth semiconductor chip, in which a circuit that easily receives noise is not disposed within said fourth semiconductor chip, a circuit that generates noise within said semiconductor chip is disposed so as to be separated from said circuit that easily receives noise, and a wire of said circuit that generates noise is disposed so as not to run parallel to a wire of said circuit that easily receives noise.

9. The semiconductor device according to claim 1, wherein a wire of a circuit that easily receives noise within said first semiconductor chip is disposed so as to extend over a conductor layer disposed on said circuit that generates noise.

10. The semiconductor device according to claim 1, wherein a third semiconductor chip is stacked in a region, on a fourth semiconductor chip, in which a circuit that easily receives noise is not disposed within said fourth semiconductor chip, and a wire of a circuit that generates noise within said third semiconductor chip is disposed so as to extend over a conductor layer disposed on said circuit that easily receives noise.

11. The semiconductor device according to claim 1, wherein said circuit that generates noise comprises a switching circuit.

12. The semiconductor device according to claim 11, wherein a wire of said circuit that generates noise is a wire that is connected to any one selected from a group consisting of an output terminal, a power supply terminal, and a ground terminal of said switching circuit.

13. The semiconductor device according to claim 1, wherein said circuit that easily receives noise comprises an analog circuit.

14. The semiconductor device according to claim 2, wherein a wire of said circuit that easily receives noise is a wire that is connected to any one selected from a group consisting of an input terminal, a power supply terminal, and a ground terminal of said analog circuit.

15. The semiconductor device according to claim 9, wherein said conductor layer is connected to a guard ring formed in a periphery of a circuit disposed under said conductor layer.

* * * * *